(12) United States Patent
Chun

(10) Patent No.: US 8,741,716 B2
(45) Date of Patent: Jun. 3, 2014

(54) SEMICONDUCTOR DEVICE WITH A GATE HAVING A BULBOUS AREA AND A FLATTENED AREA UNDERNEATH THE BULBOUS AREA AND METHOD FOR MANUFACTURING THE SAME

(75) Inventor: Sung Gil Chun, Incheon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 455 days.

(21) Appl. No.: 13/219,983

(22) Filed: Aug. 29, 2011

(65) Prior Publication Data

US 2011/0312139 A1 Dec. 22, 2011

Related U.S. Application Data

(62) Division of application No. 12/421,320, filed on Apr. 9, 2009, now Pat. No. 8,030,715.

(30) Foreign Application Priority Data

Feb. 24, 2009 (KR) ........................ 10-2009-0015115

(51) Int. Cl.
*H01L 21/336* (2006.01)

(52) U.S. Cl.
USPC ........................................ 438/270; 438/259

(58) Field of Classification Search
USPC ........................................ 438/270, 259, 700
See application file for complete search history.

(56) References Cited

U.S. PATENT DOCUMENTS 5,506,432 A 4/1996 Kurusu
7,541,656 B2 6/2009 Kim et al.

FOREIGN PATENT DOCUMENTS

| JP | 2006-097432 A | 4/2006 |
| JP | 2006-112218 A | 4/2006 |
| KR | 2004008448 A | 6/2004 |
| KR | 1020040054248 A | 6/2004 |
| KR | 1020090001392 A | 1/2009 |

OTHER PUBLICATIONS

USPTO OA mailed Jul. 22, 2010 in connection with U.S. Appl. No. 12/421,320.
USPTO OA mailed Oct. 18, 2010 in connection with U.S. Appl. No. 12/421,320.
USPTO OA mailed Mar. 10, 2011 in connection with U.S. Appl. No. 12/421,320.
USPTO NOA mailed Jun. 2, 2011 in connection with U.S. Appl. No. 12/421,320.

*Primary Examiner* — Long Pham
(74) *Attorney, Agent, or Firm* — Ladas & Parry LLP

(57) ABSTRACT

A semiconductor device with a gate having a bulbous area and a flattened area underneath the bulbous area is presented. The semiconductor device includes a semiconductor substrate, an isolation layer, a gate insulation layer, and gates. The semiconductor substrate has recess parts that have first grooves which have bulbous-shaped profiles and second vertically flattened profile grooves which extend downward from the first grooves. The gates are formed in the recess parts in which the gate insulation layer is double layered in the bulbous profile areas and is single layered in the flattened profile areas.

10 Claims, 8 Drawing Sheets

SEMICONDUCTOR DEVICE WITH A GATE HAVING A BULBOUS AREA AND A FLATTENED AREA UNDERNEATH THE BULBOUS AREA AND METHOD FOR MANUFACTURING THE SAME

CROSS-REFERENCE TO RELATED APPLICATIONS

The present application claims priority to Korean patent application number 10-2009-0015115 filed on Feb. 24, 2009, which is incorporated herein by reference in its entirety.

BACKGROUND OF THE INVENTION

The present invention relates to a semiconductor device and a method for manufacturing the same, and more particularly, to a semiconductor device that can realize a reduction in GIDL (gate-induced drain leakage) and a method for manufacturing the same.

As high integration of a semiconductor device proceeds, it is becoming more and more difficult to achieve a desired threshold voltage using conventional planar channel structures. Thus, limitations arise and alternate solutions must be present that can overcome these problems brought about by the high integration. Under these circumstances, research has actively been conducted in order to develop semiconductor devices which have three-dimensional channel structures capable of securing an effective channel length while maintaining a high integration. As a result of this research and development, semiconductor devices having recess channels or protrusion channels have already been disclosed in the art. Further, semiconductor devices having saddle fin-shaped channels, in which the recess channel and the protrusion channel are combined, have also been disclosed in the art.

In semiconductor devices having saddle fin-shaped channels, when compared to those semiconductor devices that have the more conventional planar channel structure, an effective channel length can be achieved. Since an effective channel width is increased in fin-shaped channels, then current drivability can also be improved.

The semiconductor device having the saddle fin-shaped channel is structured such that a gate forming area in an active region is recessed to a first depth and portions of an isolation layer which extend from the gate forming area are recessed underneath the gate to a second depth greater than the first depth to expose the front and rear surfaces of the gate forming area recessed to the first depth.

Unfortunately, semiconductor devices having the saddle fin-shaped channel can suffer a threshold voltage problem. Since a gate is structured to cover a channel area, then the threshold voltage (Vt) drop occurs as compared to a semiconductor device which has a recess channel capable of securing reliability in terms of characteristics thereof. In order to cope with this problem, the concentration of boron in the channel is often increased. However, if this is the case, then electric fields in junction areas are intensified, and the junction leakage increases. As a result the refresh characteristics are likely to degrade.

In addition, more conventional semiconductor devices that have the saddle fin-shaped channel configuration are made by using radical gate oxidation fabrication schemes in which the growth of an oxide layer is uniformly implemented irrespective of the directions of silicon lattices for the purpose of reducing off-leakage toward a channel area. In this case, GIDL current increases at the overlapping areas between junction areas and gates. Meanwhile, in the case where the existing dry oxidation scheme is employed instead of the radical gate oxidation scheme, degradations in terms of sub-threshold slope and DIBL (drain-induced barrier lowering) arise, whereby off-leakage increases and refresh characteristics are also likely to deteriorate.

As a result, in the conventional semiconductor device having the saddle fin-shaped channel, a retention time is shortened when compared to the semiconductor device having a recess channel.

SUMMARY OF THE INVENTION

Embodiments of the present invention are directed to a semiconductor device that can prevent or at least minimize the degradation of refresh characteristics from occurring and a method for manufacturing the same.

Also, embodiments of the present invention are directed to a semiconductor device that can reduce GIDL (gate-induced drain leakage) and a method for manufacturing the same.

Further, embodiments of the present invention are directed to a semiconductor device that exhibit lengthen retention times and a method for manufacturing the same.

In one aspect of the present invention, a semiconductor device comprises a semiconductor substrate having recess parts defined in gate forming areas thereof, the recess parts including first grooves which have a bulbous-shaped profile and second grooves which extend downward from the first grooves; an isolation layer formed in the semiconductor substrate that exposes front and rear surfaces of the gate forming areas in which the recess parts are defined; a gate insulation layer formed on surfaces of the recess parts and on the exposed front and rear surfaces of the gate forming areas and having a thickness that is greater in the first grooves of the recess parts than the other portions of the recess parts; and gates formed in the recess parts in which the gate insulation layer is formed and on the exposed front and rear surfaces of the gate forming areas.

The isolation layer has a structure in which portions of the isolation layer extending from the gate forming areas are recessed in a manner such that the recessed gate forming areas can project out of the isolation layer.

The gate insulation layer is formed within the first grooves in the recess parts and has a double-layered structure.

The double-layered structure of the gate insulation layer includes a first insulation layer which is formed on the surfaces of the first grooves and a second insulation layer which is formed on the first insulation layer.

The gate insulation layer formed within the second grooves in the recess parts has a single-layered structure.

The gates can have a stack-like structure of a first conductive layer formed on the gate insulation layer, a second conductive layer formed on the first conductive layer, and a hard mask layer formed on the second conductive layer.

The first conductive layer may comprise any conductive type of material such as a polysilicon layer.

The second conductive layer may comprise any type of conductive material such as a metal-based layer.

The hard mask layer may comprise any type of hard mask material such as a nitride layer.

The semiconductor device may further comprise gate spacers formed on both sidewalls of the gates.

The semiconductor device further comprises junction areas formed within a surface of the active region along both sides of the gates.

In another aspect of the present invention, a method for manufacturing a semiconductor device comprises the steps of forming an isolation layer in a semiconductor substrate to define an active region; defining first grooves which have a bulbous-shaped profile in the active region; forming a first insulation layer on surfaces of the first grooves; defining recess parts by etching lower portions of the first insulation layer in the first grooves into the active region below the first grooves to thereby define second grooves; etching the isolation layer to expose front and rear surfaces of the gate forming areas in which the recess parts are defined; forming a second insulation layer within the recess parts including the first insulation layer, and thereby forming a gate insulation layer including the first insulation layer and the second insulation layer; and forming gates in the recess parts in which the gate insulation layer is formed and on the exposed front and rear surfaces of the gates.

The step of defining the first grooves having the bulbous-shaped profile comprises the steps of forming a recess mask on the semiconductor substrate which is formed with the isolation layer, to expose gate forming areas of the active region; and isotropically etching the gate forming areas of the active region which are exposed through the recess mask.

The recess mask is formed of an oxide layer and a nitride layer.

The first insulation layer may be formed by using a radical oxidation process.

The second insulation layer may be formed by using a radical oxidation process.

The gates can have a stack-like structure of a first conductive layer formed on the gate insulation layer formed in the recess parts, a second conductive layer formed on the first conductive layer, and a hard mask layer formed on the second conductive layer.

The first conductive layer may comprise a polysilicon layer.

The second conductive layer may comprise a metal-based layer.

The hard mask layer may comprise a nitride layer.

After the step of forming the gates, the method may further comprise the step of forming gate spacers on both sidewalls of the gates.

After the step of forming the gates, the method may further comprises the step of forming junction areas in a surface of the active region on both sides of the gates.

DESCRIPTION OF SPECIFIC EMBODIMENTS

Hereafter, specific embodiments of the present invention will be described in detail with reference to the accompanying drawings.

Figure 1:
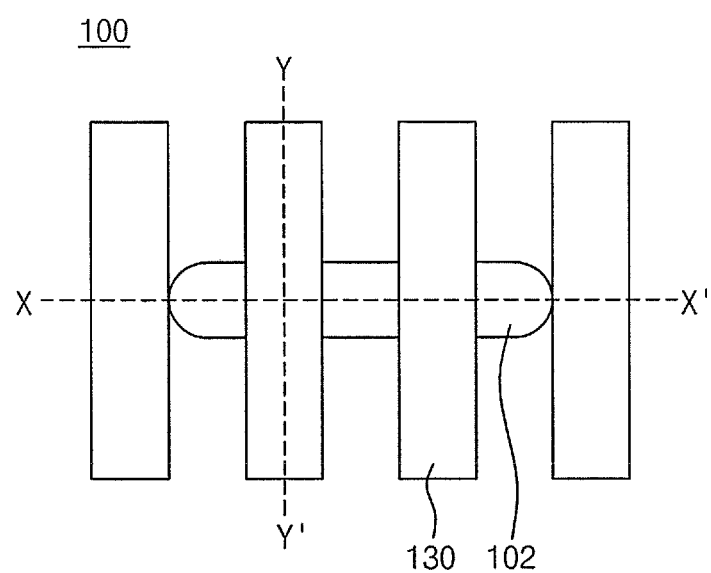
FIG. 1 is a plan view illustrating a semiconductor device in accordance with an embodiment of the present invention.
Figure 2A:
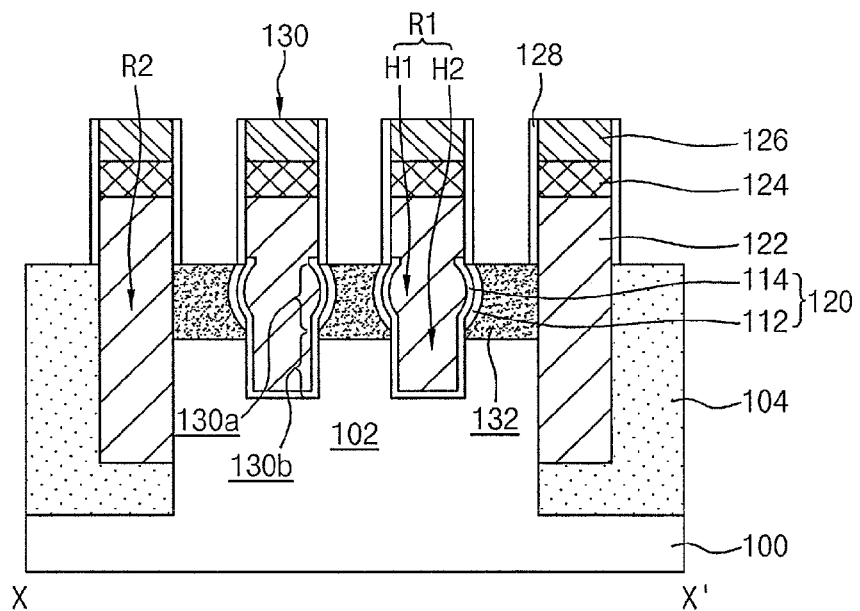
FIGS. 2A and 2B are sectional views taken along the lines X-X' and Y-Y', respectively, of FIG. 1.
Figure 2B:
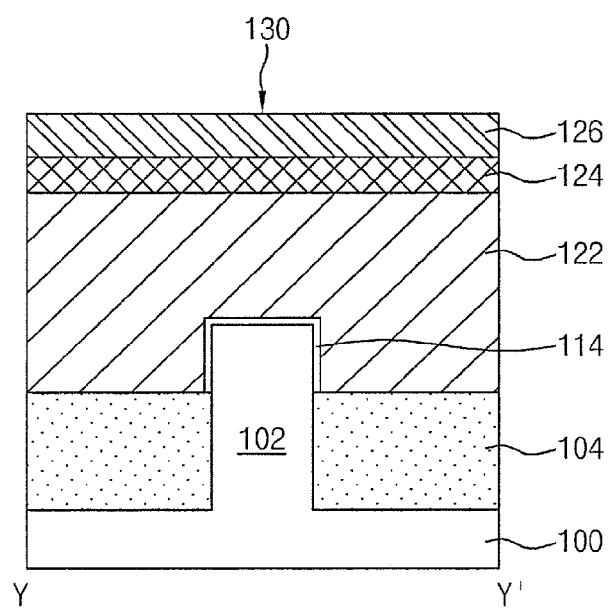

FIG. 1 is a plan view illustrating a semiconductor device in accordance with an embodiment of the present invention, and FIGS. 2A and 2B are sectional views taken along the lines X-X' and Y-Y', respectively, of FIG. 1.

Referring to these drawings, an isolation layer 104 is formed in a semiconductor substrate 100 to delimit an active region 102. First recess parts R1 are defined in the gate forming areas of the active region 102 to a first depth. Second recess parts R2 are defined in portions of the isolation layer 104, which extend from the gate forming areas, to a second depth greater than the first depth to expose the front and rear surfaces of the gate forming areas recessed to the first depth, that is, to obtain a saddle fin-shaped channel. Each first recess part R1 is composed of a first groove H1 which is defined in the surface of the semiconductor substrate 100 and has a bulbous-shaped profile and a second groove H2 which extends downward from the first groove H1 and has a vertical profile.

Gates 130 are formed in the gate forming areas of the active region 102 in which the first recess parts R1 are defined and in the portions of the isolation layer 104 which extend from the gate forming areas and in which the second recess parts R2 are defined. Gate spacers 128 are formed on both sidewalls of the gates 130, and junction areas 132 are formed in the active region 102 on both sides of the gates 130 including the gate spacers 128.

Each gate 130 can have a stack-like structure of a gate insulation layer 120, a first gate conductive layer 122 formed of polysilicon material, a second gate conductive layer 124 formed of a metallic material such as tungsten, and a hard mask layer 126 comprising a nitride layer. One embodiment is that the gates 130 may be formed in lines that extend across the action region 102 and onto the isolation layer 104. Each gate 130 is formed in the shape of a saddle fin gate 130.

The gate insulation layer 120 includes a first insulation layer 112 formed within the first groove H1 which has a bulbous-shaped profile. The gate insulation layer 120 also includes a second insulation layer 114 formed within the first groove H1 and within the second groove H2. As a result, a portion of the gate insulation layer 120 has a double-layered structure formed in the first groove H1 that includes the first insulation layer 112 and the second insulation layer 114. However in the second groove H2 the gate insulation layer 120 has a single-layered structure including only the second insulation layer 114.

In the semiconductor device according to the embodiment of the present invention, configured as mentioned above, due to the fact that a portion of a gate insulation layer 120, which overlaps with junction areas 132, has a double-layered structure and possesses an increased thickness when compared to the conventional art, GIDL can be decreased.

As a consequence, in the semiconductor device according to the embodiment of the present invention, a retention time can be lengthened through the decrease of GIDL. As a result, refresh characteristics of the resulting semiconductor device can be improved.

The semiconductor device according to the embodiment of the present invention exhibit many of the same operational characteristics as those of the conventional semiconductor devices that have saddle fin gates. In particular, the controllability of a saddle fin gate is determined depending upon the thickness of a gate insulation layer which covers a channel. In the case of the semiconductor device according to the embodiment of the present invention, since a portion of the gate insulation layer 120, which covers the bottom and the front and rear surfaces of the gate 130 has a single-layered structure composed of second insulation layer 114 having essentially the same thickness as a more conventional gate insulation layer having a single-layered structure. Accordingly, the same or nearly the same operational characteristics as those of the conventional semiconductor device having the saddle fin gates are expected to be exhibited.

Hereinbelow, a method for manufacturing a semiconductor device in accordance with another embodiment of the present invention will be described in detail with reference to FIGS. 3A through 3F and FIGS. 4A through 4F. FIGS. 3A through 3F are sectional views taken in correspondence to the line X-X' of FIG. 1, illustrating the processes of the method, and FIGS. 4A through 4F are sectional views taken in correspondence to the line Y-Y' of FIG. 1, illustrating the processes of the method.

Figure 3A:
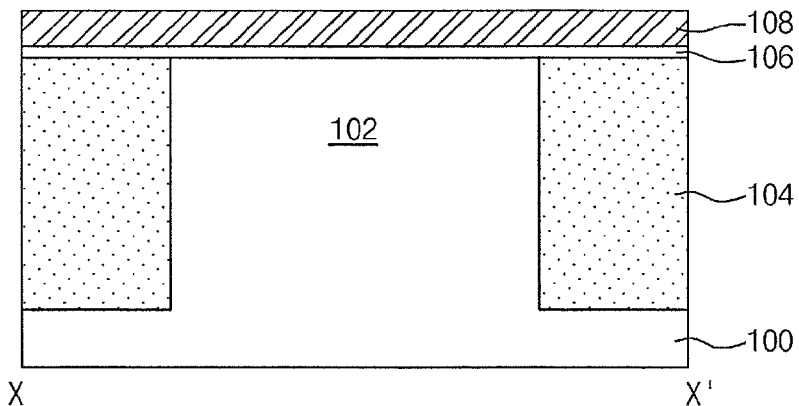
FIGS. 3A through 3F are sectional views taken in correspondence to the line X-X' of FIG. 1, illustrating the processes of a method for manufacturing a semiconductor device in accordance with another embodiment of the present invention.
Figure 4A:
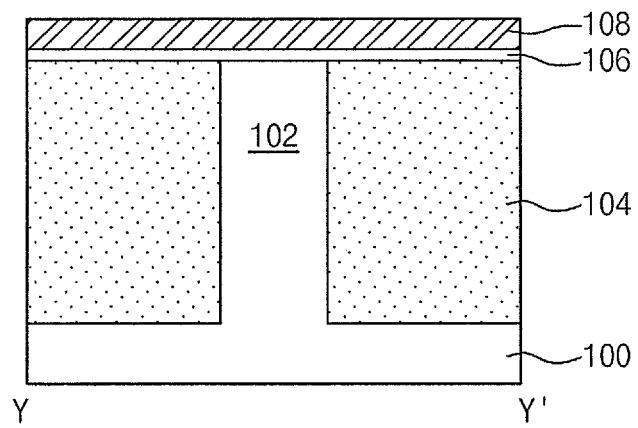
FIGS. 4A through 4F are sectional views taken in correspondence to the line Y-Y' of FIG. 1, illustrating the processes of the method for manufacturing a semiconductor device in accordance with another embodiment of the present invention.

Referring to FIGS. 3A and 4A, an isolation layer 104 is formed in a semiconductor substrate 100 is made to define an active region 102. The isolation layer 104 may be formed by filling an oxide layer in trenches, for example, through an STI (shallow trench isolation) process. An oxide layer 106 and a nitride layer 108 are sequentially formed on the semiconductor substrate 100 including the isolation layer 104 as the materials that comprises the recess mask.

Figure 3B:
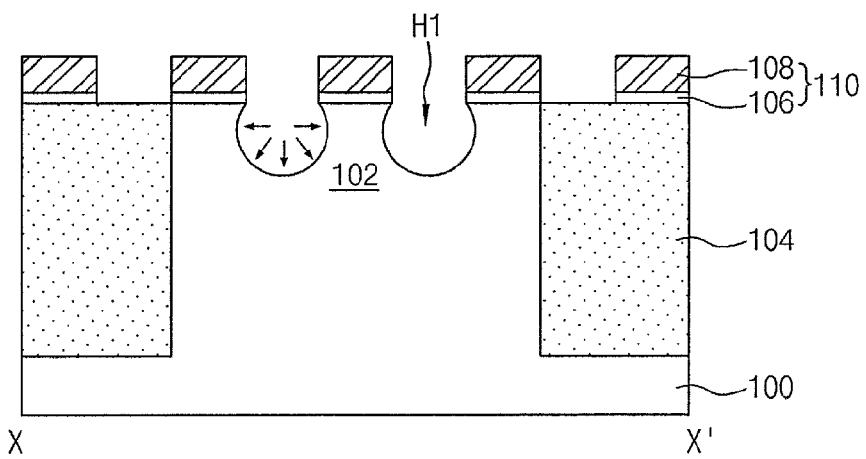
Figure 4B:
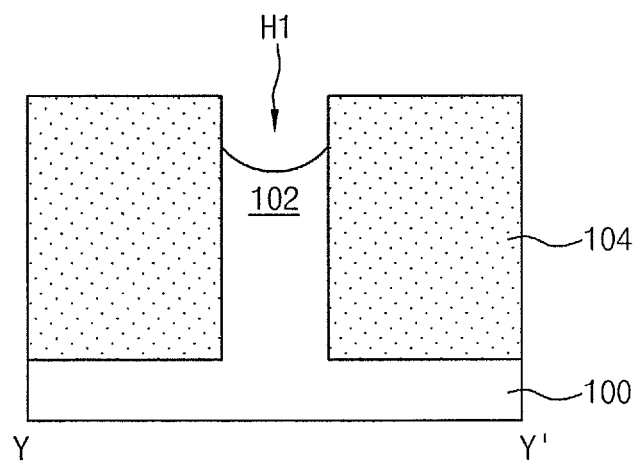

Referring to FIGS. 3B and 4B, by selectively etching the nitride layer 108 and the oxide layer 106, a recess mask 110 is formed which exposes portions of the active region 102 for eventually building the gates 130. By isotropically etching into these exposed areas in the active region 102, first grooves H1 having a bulbous-shaped profile are defined at a first depth. The reason why the first grooves H1 are defined by using isotropic etching to have the bulbous-shaped profile is to eventually provide an additional protection of a first insulation layer 112. The first insulation layer 112 will be then formed within the first grooves H1 and may comprise an oxide layer.

Figure 3C:
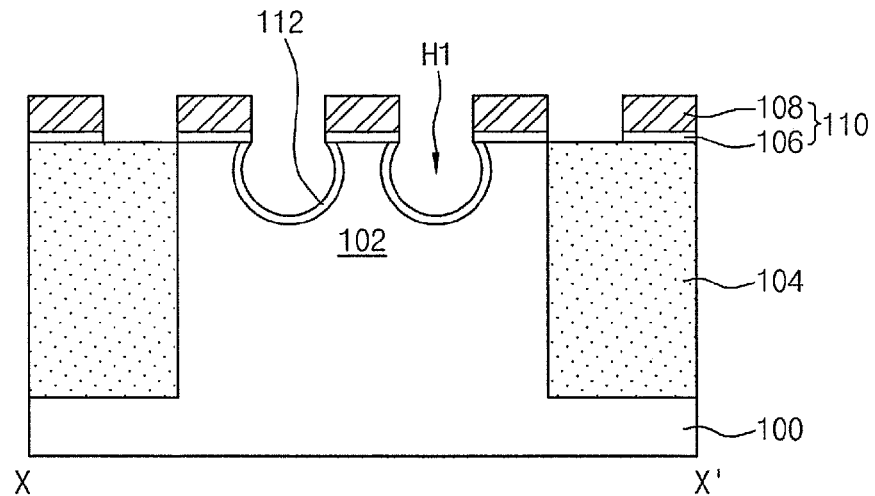
Figure 4C:
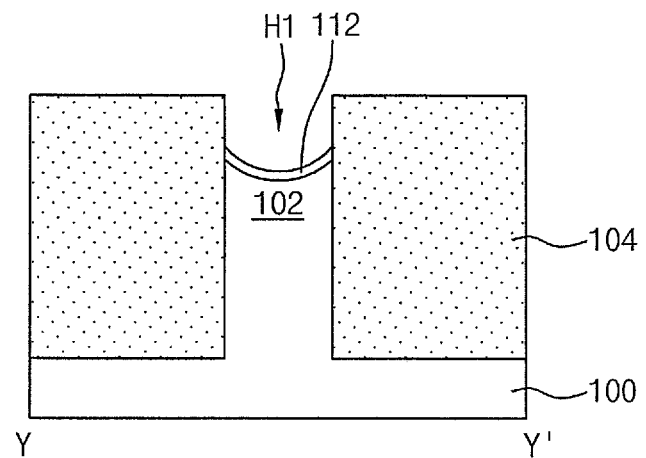

Referring to FIGS. 3C and 4C, by conducting a pre-gate oxidation process for the resultant semiconductor substrate 100 within the first grooves H1 having the bulbous-shaped profile, a first insulation layer 112 comprising an oxide layer is formed within is the first grooves H1.

Figure 3D:
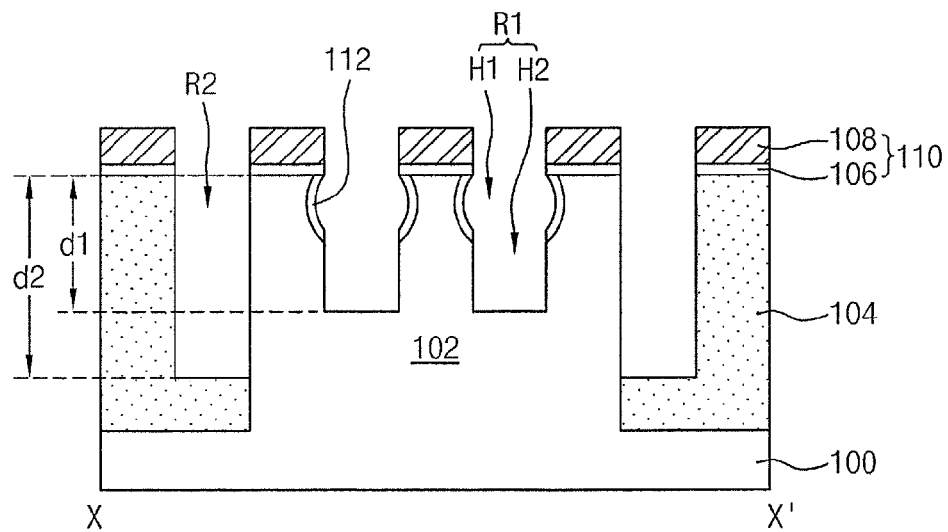
Figure 4D:
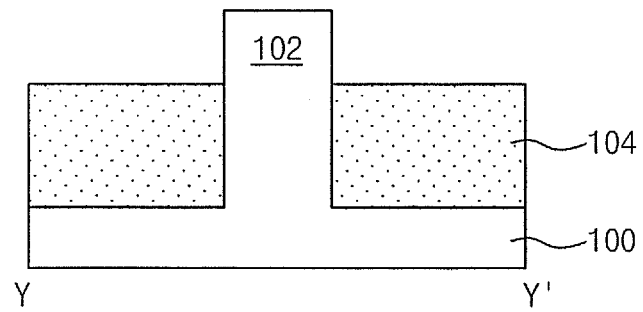

Referring to FIGS. 3D and 4D, by conducting an etching process on the resultant semiconductor substrate 100 having the first insulation layer 112, portions of the first insulation layer 112 are removed. As a result, portions of the first insulation layer 112 which are formed on the bottoms of the first grooves H1 are removed. Also as a result, portions of the first insulation layer 112 which are formed along the sidewalls of the first grooves H1 are not removed and subsequently remain within the first groove H1.

Accordingly, as a result of the an etching process into first insulation layer 112 within the first grooves H1, second grooves H2 are formed having a substantially vertical profile are defined below the first grooves H1. Through this, first recess parts R1, which include first grooves H1 have a first depth, and second grooves H2 have a second depth. At the same time, by etching portions of the isolation layer 104 which extend from the gate forming areas of the active region 102, second recess parts R2 having a second depth greater than the first depth of the first recess parts R1 are defined in the portions of the isolation layer 104 which extend from the gate forming areas of the active region 102.

Figure 3E:
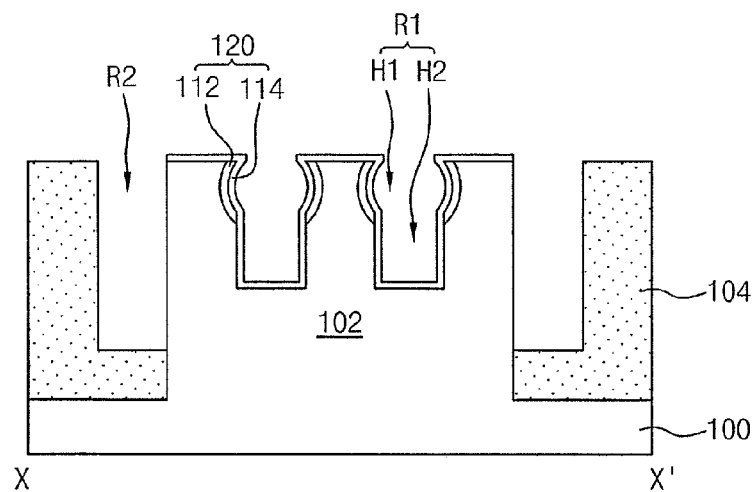
Figure 4E:
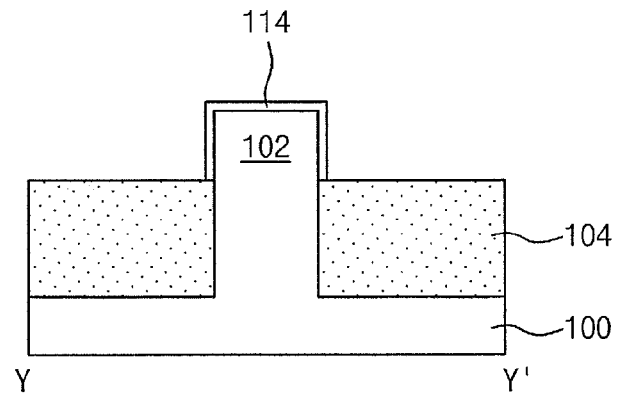

Referring to FIGS. 3E and 4E, the recess mask 110 composed of the stack pattern of the oxide layer 106 and the nitride layer 108 is removed. Then, by conducting a gate oxidation process on the resultant semiconductor substrate 100, a second insulation layer 114 comprising an oxide layer is formed within the first grooves H1 and the second grooves H2. Through this, a gate insulation layer 120 including the first insulation layer 112 and the second insulation layer 114 is formed.

As a result, the gate insulation layer 120 has a double-layered structure of the first insulation layer 112 and the second insulation layer 114 on the sidewalls of the first grooves H1, and a single-layered structure of the second insulation layer 114 on the surfaces of the second grooves H2.

Figure 3F:
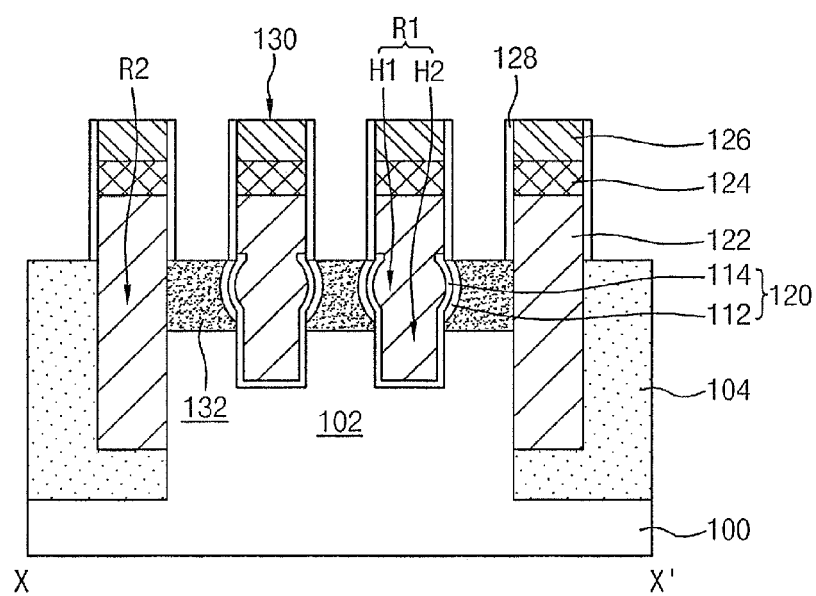
Figure 4F:
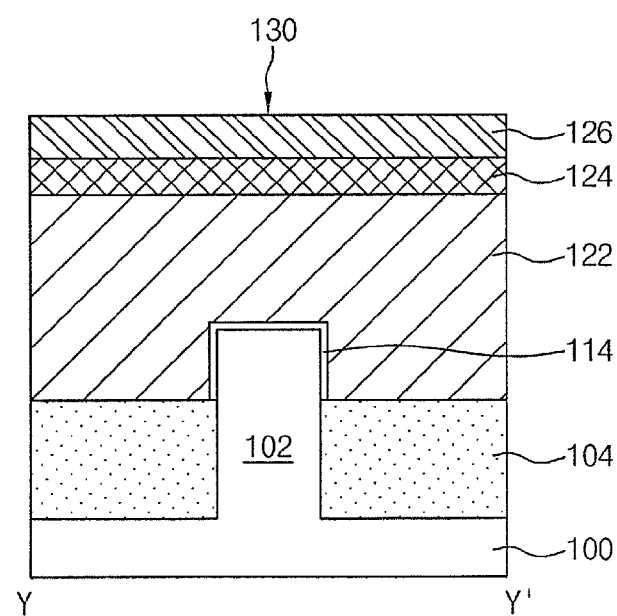

Referring to FIGS. 3F and 4F, a first gate conductive layer 122 comprising, for example, a polysilicon layer is formed on the gate insulation layer 120 that fills in the first and second recess parts R1 and R2. A second gate conductive layer 124 comprising, for example, a metal-based layer is then formed on the first gate conductive layer 122, and a hard mask layer 126 comprising a nitride layer is then formed on the second gate conductive layer 124. Thereupon, by etching the hard mask layer 126, the second gate conductive layer 124, the first gate conductive layer 122 and the gate insulation layer 120, gates 130 are formed. When viewed in entirety, the gates 130 are formed in lines which extend across the gate forming areas of the active region 102 and the portions of the isolation layer 104 extending from the gate forming areas. In the active region 102, the gates 130 are formed in the shape of saddle fin gates which cover the bottoms and the front and rear surfaces of the first recess parts R1.

Subsequently gate spacers 128 may be formed on both sidewalls of the gates 130. The gate spacers 128 may comprise, for example, a nitride layer. As the case may be, the gate spacers 128 can be formed as a single layer of an oxide layer or a stack of an oxide layer and a nitride layer.

Thereafter, while not shown in a drawing, by sequentially conducting a series of subsequent well-known processes including a landing plug forming process, the manufacture of a semiconductor device in accordance with another embodiment of the present invention is completed.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming an isolation layer in a semiconductor substrate to delimit an active region;
    defining first grooves, which have a bulbous-shaped profile, in gate forming areas of the active region;
    forming a first insulation layer on surfaces of the first grooves;
    defining recess parts by etching portions of the first insulation layer which constitute bottoms of the first grooves and portions of the active region which are placed under the bottoms of the first grooves and thereby defining second grooves;
    etching the isolation layer to expose front and rear surfaces of the gate forming areas in which the recess parts are defined;
    forming a second insulation layer on surfaces of the recess parts, including the first insulation layer, to form a gate insulation layer comprising the first insulation layer and the second insulation layer; and
    forming gates in the recess parts, in which the gate insulation layer is formed, on the exposed front and rear surfaces of the gate forming areas.

2. The method according to claim 1, wherein the step of defining the first grooves having the bulbous-shaped profile comprises the steps of:

forming a recess mask on the semiconductor substrate which is formed with the isolation layer, to expose gate forming areas of the active region; and isotropically etching the gate forming areas of the active region which are exposed through the recess mask.

3. The method according to claim 2, wherein the step of forming the recess mask layer comprises an oxidation step followed by a nitriding step.

4. The method according to claim 1, wherein the first insulation layer is formed using a radical oxidation process.

5. The method according to claim 1, wherein the second insulation layer is formed using a radical oxidation process.

6. The method according to claim 1, wherein the gates comprise a first conductive layer stacked on the gate insulation layer, a second conductive layer stacked on the first conductive layer, and a hard mask layer stacked on the second conductive layer.

7. The method according to claim 6, wherein the first conductive layer comprises a polysilicon layer, and the second conductive layer comprises a metal-based layer.

8. The method according to claim 6, wherein the hard mask layer comprises a nitride layer.

9. The method according to claim 1, further comprises the step of forming gate spacers on the gates after the step of forming the gates.

10. The method according to claim 1, further comprises the step of forming junction areas in the active region on both sides of the gates after the step of forming the gates.

* * * * *